(12) United States Patent
Ui

(10) Patent No.: US 7,944,492 B2
(45) Date of Patent: May 17, 2011

(54) SOLID-STATE IMAGE PICKUP DEVICE AND CAMERA SYSTEM

(75) Inventor: Hiroki Ui, Tokyo (JP)

(73) Assignee: Sony Corporation, Tokyo (JP)

( * ) Notice: Subject to any disclaimer, the term of this patent is extended or adjusted under 35 U.S.C. 154(b) by 489 days.

(21) Appl. No.: 12/081,908

(22) Filed: Apr. 23, 2008

(65) Prior Publication Data

US 2008/0278615 A1 Nov. 13, 2008

(30) Foreign Application Priority Data

May 10, 2007 (JP) ................................ 2007-126150

(51) Int. Cl.
*H04N 3/14* (2006.01)
*H04N 5/335* (2011.01)

(52) U.S. Cl. .......................... 348/308; 348/294; 348/372

(58) Field of Classification Search .................. 348/294, 348/308, 372
See application file for complete search history.

(56) References Cited

U.S. PATENT DOCUMENTS

| 7,030,928 | B2 * | 4/2006 | Inagaki | 348/372 |
|---|---|---|---|---|
| 2001/0033331 | A1 * | 10/2001 | Eto et al. | 348/208 |
| 2002/0054221 | A1 * | 5/2002 | Hamamura | 348/231 |
| 2007/0126925 | A1 * | 6/2007 | Masuda et al. | 348/375 |
| 2008/0211944 | A1 * | 9/2008 | Yamauchi | 348/294 |

FOREIGN PATENT DOCUMENTS

| JP | 11-018002 | 1/1999 |
|---|---|---|
| JP | 2001-285723 | 10/2001 |
| JP | 2002-300466 | 10/2002 |
| JP | 2004-112422 | 4/2004 |
| JP | 2006-237381 | 9/2006 |
| JP | 2006-319951 | 11/2006 |
| WO | WO-2006/090492 A1 | 8/2006 |

OTHER PUBLICATIONS

Japanese Office Action issued Mar. 17, 2009 for corresponding Japanese Application No. 2007-126150.

* cited by examiner

*Primary Examiner* — Gevell Selby
(74) *Attorney, Agent, or Firm* — Rader, Fishman & Grauer PLLC

(57) ABSTRACT

A solid-state image pickup device, including: a pixel section including at least one pixel circuit including a mechanism for converting an optical signal into an electric signal and accumulating the electric signal in response to exposure time; a pixel driving section configured to drive the pixel section to carry out signal accumulation and signal outputting; at least one different circuit section configured to carry out a process relating to accessing to the pixel section through the pixel driving section; and a control section configured to control, at least upon the signal accumulation of the pixel circuit, the pixel driving section so as to maintain the pixel circuit in a state wherein the pixel circuit accumulates the electric signal and control supply of a power supply voltage to the different circuit section.

7 Claims, 9 Drawing Sheets

SOLID-STATE IMAGE PICKUP DEVICE AND CAMERA SYSTEM

CROSS REFERENCES TO RELATED APPLICATIONS

The present invention contains subject matter related to Japanese Patent Application JP 2007-126150 filed with the Japan Patent Office on May 10, 2007, the entire contents of which being incorporated herein by reference.

BACKGROUND OF THE INVENTION

1. Field of the Invention

This invention relates to a solid-state image pickup device represented by a CMOS image sensor and a camera system.

2. Description of the Related Art

In recent years, attention is paid to a CMOS image sensor as a solid-state image pickup device or image sensor in place of a CCD image sensor.

This is because the CMOS image sensor overcomes various problems such as a problem that, since a plurality of power supply voltages are required for operation and a plurality of peripheral ICs must operate in combination, the system is much complicated.

The CMOS image sensor has such a plurality of significant merits as described below. In particular, the CMOS image sensor can be fabricated using a fabrication process similar to that for fabrication of popular CMOS type integrated circuits and can be driven with a single power supply. Further, the CMOS image sensor allows mixed formation of analog circuits and logic circuits in the same chip using a CMOS process, and therefore, the number of peripheral ICs can be reduced.

An output circuit of a CCD image sensor in most cases outputs a 1-channel (ch) output using a floating diffusion (FD) amplifier having an FD layer.

In contrast, a CMOS image sensor includes an FD amplifier for each pixel and in most cases outputs such parallel column outputs by selecting a certain row of a pixel array and reading out the pixels in the row at the same time in a direction along the columns.

This is because it is difficult for the FD amplifiers disposed in the pixels to have a sufficient driving capacity and, accordingly it, is necessary to use a low data rate. It is advantageous to use parallel processing.

In the following, a popular CMOS image sensor is described.

FIG. 1 shows an example of a pixel of a CMOS image sensor formed from four transistors.

Referring to FIG. 1, the pixel 1 includes, for example, a photodiode 11 as a photoelectric conversion device. The pixel 1 further includes four transistors including a transfer transistor 12, an amplification transistor 13, a selection transistor 14 and a reset transistor 15 as active devices for the photodiode 11.

The photodiode 11 photoelectrically converts incoming light into charge, here, electrons, whose amount corresponds to the light amount of the incoming light.

The transfer transistor 12 is connected to the photodiode 11 and a floating diffusion FD and transfers electrons produced by photoelectric conversion by the photodiode 11 to the floating diffusion FD when a driving signal is applied to the gate, that is, a transfer gate, thereof through a transfer control line LTx.

The amplification transistor 13 is connected at the gate thereof to the floating diffusion FD. The amplification transistor 13 is connected to a signal line LSGN through the selection transistor 14 and cooperates with a constant current source outside the pixel to form a source follower.

An address signal is applied to the gate of the selection transistor 14 through a selection control line LSEL, and if the selection transistor 14 is turned on, then the amplification transistor 13 amplifies the potential at the floating diffusion FD and outputs a voltage corresponding to the potential to the signal line LSGN. A voltage outputted from each pixel is outputted to a pixel output data parallel-serial processing section through the signal line LSGN.

The reset transistor 15 is connected between a power supply line LVDD and the floating diffusion FD and resets the potential at the floating diffusion FD to the potential of the power supply line LVDD when a reset signal is applied to the gate of the reset transistor 15 through a reset control line LRST.

FIG. 2 shows an example of a general configuration of a CMOS image sensor or solid-state image pickup device wherein such pixels as shown in FIG. 1 are arrayed in a two-dimensional array.

Referring to FIG. 2, the CMOS image sensor 20 shown includes a pixel array section 21, an address decoder 22, a pixel driving pulse generation circuit 23, and a level shifter group 24. The CMOS image sensor 20 further includes a pixel output data parallel-serial processing section 25, an output circuit section 26, a sensor control section 27, and external power supplies 28 and 29 each in the form of a cell.

In the CMOS image sensor 20, a power supply voltage VDD is supplied to the address decoder 22, pixel driving pulse generation circuit 23, pixel output data parallel-serial processing section 25, output circuit section 26 and sensor control section 27 in the inside of a chip from the power supply 28. Meanwhile, another power supply voltage VDD is supplied to the level shifter group 24 and the pixel array section 21 from the power supply 29.

In the CMOS image sensor 20, the sensor control section 27 generates an address for designating a pixel array row to be accessed and sends the address to the address decoder 22.

The address decoder 22 renders an output thereof corresponding to the designated pixel row active. Then, to the row designated by the address decoder 22, a pixel reset pulse LRST and pixel readout pulses LTx and LSEL are supplied to the pixels 1 for each row from the pixel driving pulse generation circuit 23. Image outputs from the pixels 1 are transferred for each row through the signal line LSGN to the pixel output data parallel-serial processing section 25.

Then, image data are outputted for one by one pixel from the pixel output data parallel-serial processing section 25, and the output data are outputted to the outside of the chip through the output circuit section 26.

The sensor control section 27 is a control logic circuit which controls the series of operations.

Referring to FIG. 1 again, in order to reset the pixel, the transfer transistor 12 is turned on to sweep out charge accumulated in the photodiode 11. Thereafter, the transfer transistor 12 is turned off, and the photodiode 11 converts a light signal into charge and accumulates the charge.

Upon reading out, the reset transistor 15 is turned on to reset the floating diffusion FD, and then the reset transistor 15 is turned off and the voltage at the floating diffusion FD then is outputted through the amplification transistor 13 and the selection transistor 14. The output in this instance is hereinafter referred to as P-phase output.

Thereafter, the transfer transistor 12 is turned on to transfer the charge accumulated in the photodiode 11 to the floating diffusion FD, and the voltage at the floating diffusion FD at this time is outputted through the amplification transistor 13. The output in this instance is hereinafter referred to as D-phase output.

By setting the difference between the D-phase output and the P-phase output to an image signal, not only a dispersion of the DC component of the output of each pixel but also FD reset noise of the floating diffusion can be removed from the image signal.

The operations described are carried out simultaneously for pixels of one row since, for example, the gates of the transfer transistors 12, selection transistors 14 and reset transistors 15 are connected in a unit of a row.

SUMMARY OF THE INVENTION

As seen in FIG. 2, the CMOS image sensor 20 requires not only the pixel array section 21 but also a large number of peripheral circuits. There is the possibility that leak current called dark current of the photoelectric conversion devices 11 of the pixels may be increased by heat generated by the peripheral circuits. It is known that dark current increases output signals of pixels and a dispersion of the output signals gives rise to appearance of a coarse image suffering from fixed pattern noise. Therefore, it is necessary to design the CMOS image sensor 20 such that heat of the peripheral circuits may not give rise to increase of dark current of the pixels.

However, if signal accumulation is carried out for a long period of time, then also the dark current arising from heat of the peripheral circuits is accumulated, the problem of heat of the peripheral circuits becomes further significant. In such an instance, since the image sensor does not output a signal, current consumption can be suppressed by stopping circuit operation while the state wherein a signal is accumulated in the pixels continues.

However, as a refinement of transistors progresses, off leak current of the transistors is increasing.

Besides, in the CMOS image sensor 20, since functions are integrated on the chip, the number of transistors increases and the leak current of the entire chip further increases.

Therefore, such a situation that, even if the circuit operation is stopped, the heat generation by leak current reaches a level at which it has an influence on the display image may possibly occur.

Besides, if refinement of the fabrication process for integrating higher functions further progresses in order to achieve higher functions of a CMOS image sensor, the leak current increases, and particularly where high speed operation is required, suppression of the leak current becomes difficult. Further, if the number of transistors to be integrated increases, heat generation further increases.

As a result, in a digital still camera, particularly in a single-lens reflex camera wherein accumulation operation for a long period of time is required in a bulb mode or the like, increase of heat generation by leak current of peripheral circuits becomes a problem.

As a technique for suppressing leak current of a transistor, a technique is available which modulates, when the operation speed of the transistor may be low, a substrate bias to raise the threshold voltage of the transistor to suppress leak current.

This technique, however, is disadvantageous in that separate power supplies must be prepared for a source power supply for the transistor and a power supply for fixing the substrate and a countermeasure for modulating the substrate bias is required, which makes design of both of a chip and a system difficult.

Therefore, it is demanded to provide a solid-state image pickup device and a camera system by which reduction of power consumption can be anticipated without complicating the design.

According to an embodiment of the present invention, there is provided a solid-state image pickup device including a pixel section including at least one pixel circuit including a mechanism for converting an optical signal into an electric signal and accumulating the electric signal in response to exposure time, a pixel driving section configured to drive the pixel section to carry out signal accumulation and signal outputting, at least one different circuit section configured to carry out a process relating to accessing to the pixel section through the pixel driving section, and a control section configured to control, at least upon the signal accumulation of the pixel circuit, the pixel driving section so as to maintain the pixel circuit in a state wherein the pixel circuit accumulates the electric signal and control supply of a power supply voltage to the different circuit section.

Preferably, the control section supplies, upon the signal accumulation of the pixel circuit, the power supply voltage to the pixel driving section and stops the supply of the power supply voltage to the processing section.

Alternatively, the control section may supply, upon the signal accumulation of the pixel circuit, the power supply voltage to the pixel driving section and lowers the power supply voltage and supply the lowered power supply voltage to the different circuit section.

Preferably, the pixel driving section maintains the pixel circuit in the state wherein the pixel circuit accumulates the electric signal in response to a control signal received from the control section.

In this instance, preferably the pixel section, pixel driving section and different circuit section are integrated as an integrated circuit, and the control signal is supplied from the outside.

Alternatively, the solid-state image pickup device may be configured such that the pixel section, pixel driving section and different circuit section are integrated as an integrated circuit, and the control signal is retained in the integrated circuit.

Preferably, the solid-state image pickup device further includes a memory section configured to store a status of any of the circuits, to which the supply of the power supply voltage is stopped, before the power supply voltage is supplied, the control section controlling the memory to retain the stored substance of the memory section also when the different circuit section is in an inoperative state as a result of the control of the supply of the power supply voltage to the different circuit section.

Preferably, the pixel circuit includes an active device configured to output the accumulated signal to a signal line, and the control section controls the potentials at a power supply line to which the active device is connected and the signal line so as to be equal to each other within the signal storage period.

According to another embodiment of the present invention, there is provided a camera system including a solid-state image pickup device, an optical system configured to form an image of an image pickup object on the image pickup device, and a signal processing circuit configured to process an output image signal of the image pickup device, the solid-state image pickup device including a pixel section including at least one pixel circuit having a mechanism for converting an optical signal into an electric signal and accumulating the electric signal in response to exposure time, a pixel driving section configured to drive the pixel section to carry out signal accumulation and signal outputting, at least one different circuit section configured to carry out a process relating to accessing to the pixel section through the pixel driving section, and a control section configured to control, at least upon the signal accumulation of the pixel circuit, the pixel driving section so as to maintain the pixel circuit in a state wherein the pixel circuit accumulates the electric signal and control supply of a power supply voltage to the different circuit section.

According to the embodiments of the present invention, during signal storage of the pixel circuit, the pixel driving section is kept in an operative state with the power supply voltage supplied thereto while supply of the power supply voltage of the different circuit section is stopped or the power supply voltage is set to and supplied with a lowered level such that the different circuit section is kept in an inoperative state.

According to the embodiments of the present invention, reduction of the power consumption can be anticipated without inviting complication in design. Particularly, the power consumption during signal accumulation can be reduced including also leak current when a transistor used in the solid-state image pickup device and the camera system is in an off state.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

First Embodiment

Figure 1:
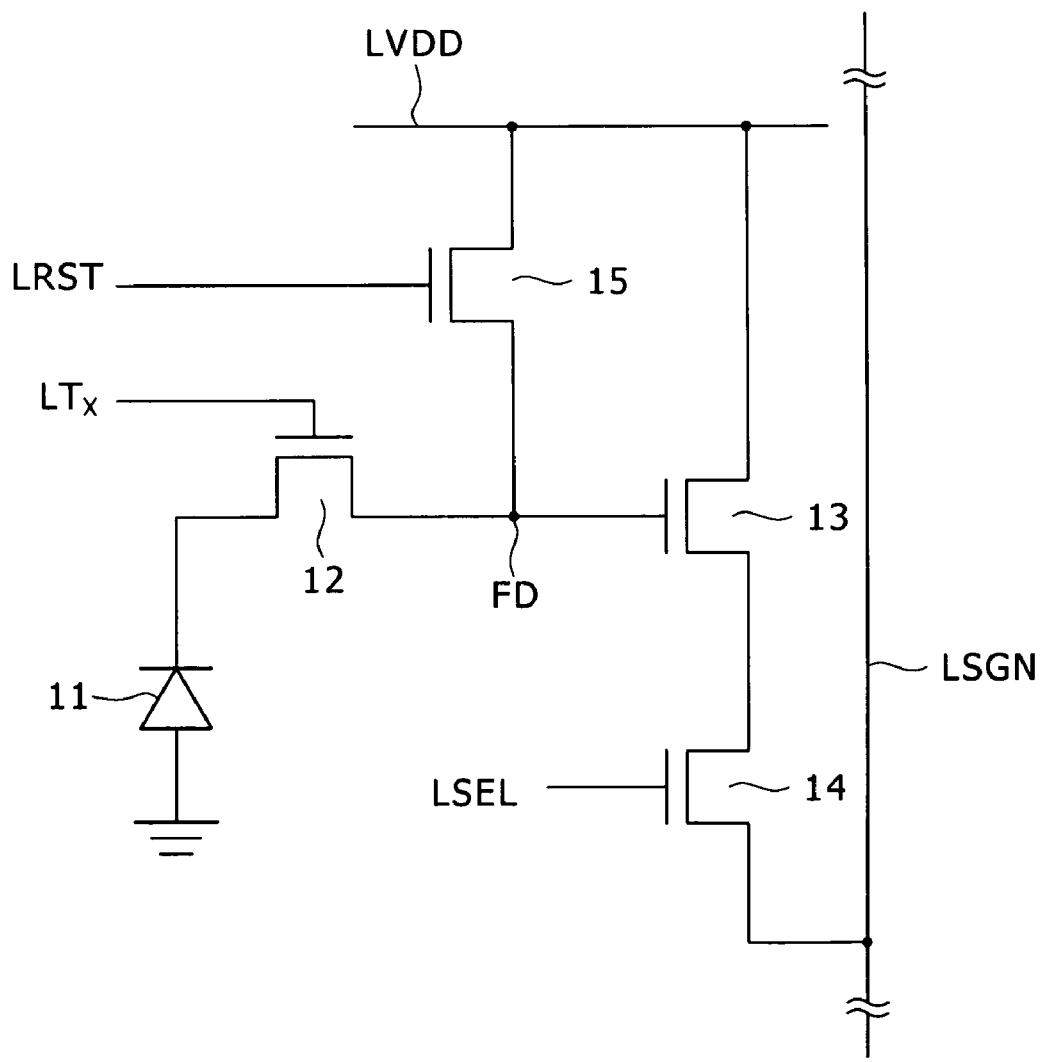
FIG. 1 is a circuit diagram showing an example of a pixel of a CMOS image sensor formed from four transistors.
Figure 2:
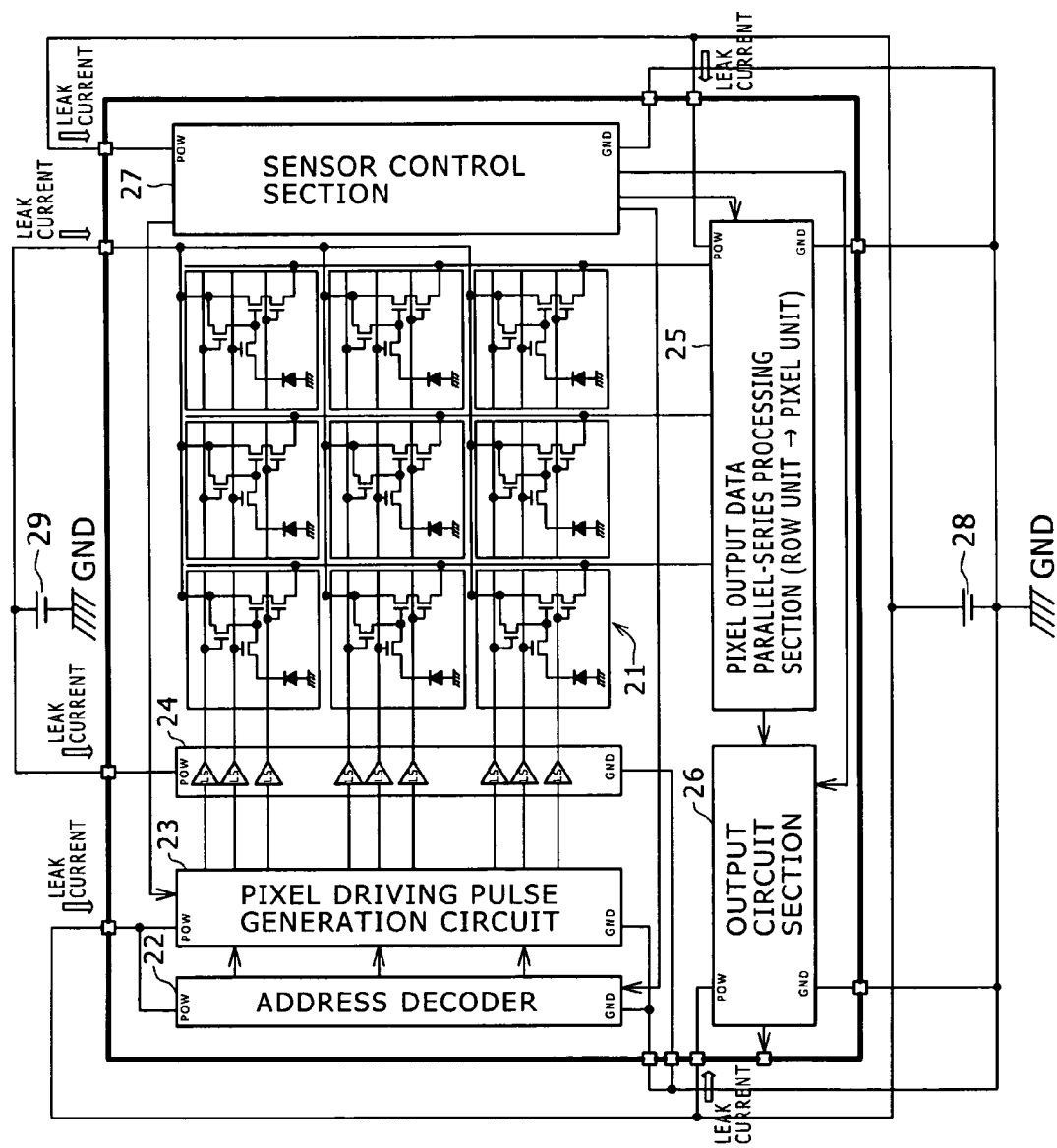
FIG. 2 is a view showing an example of a popular configuration of a CMOS image sensor or solid-state image pickup device wherein such pixels as shown in FIG. 1 are disposed in a two-dimensional array.
Figure 3:
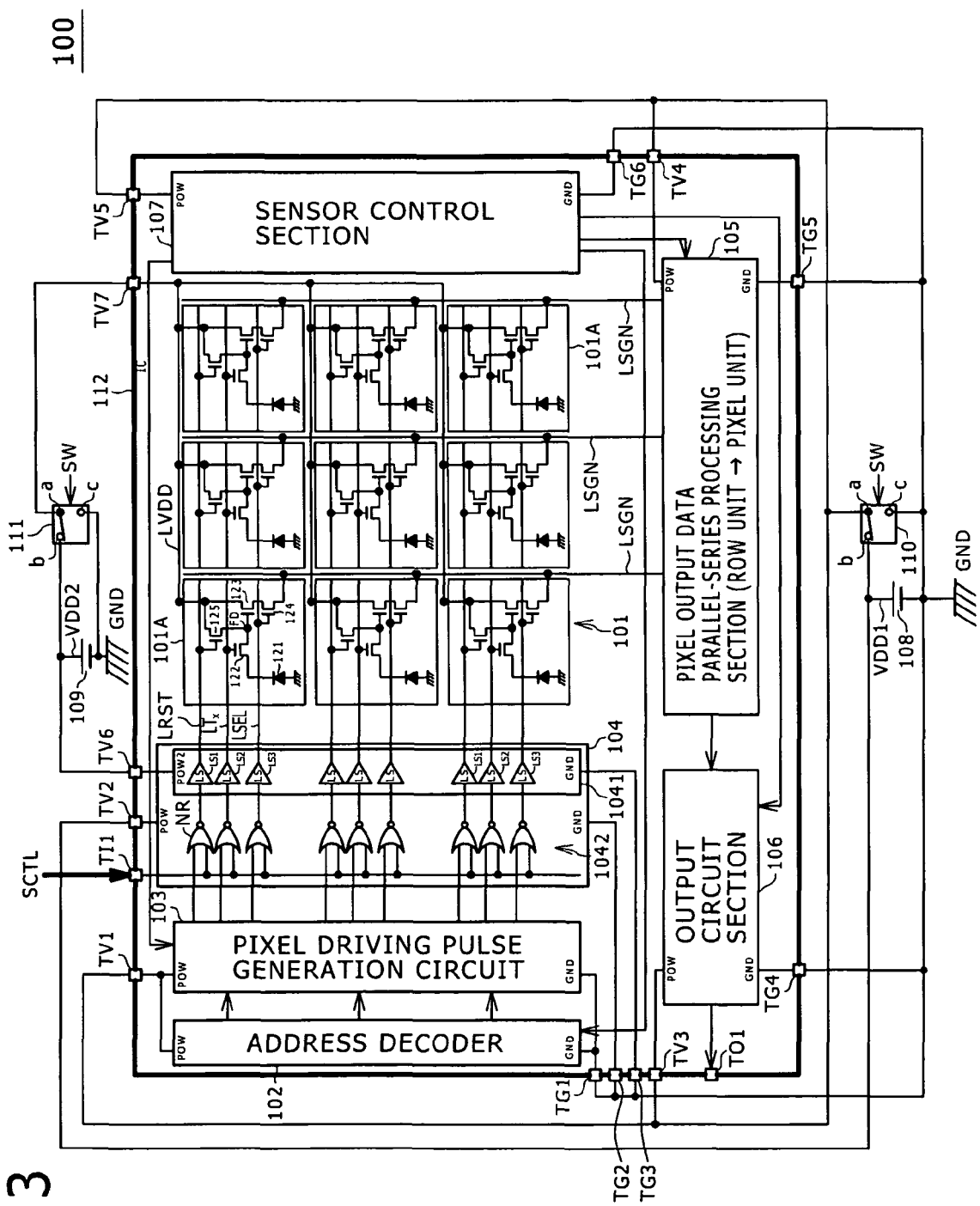
FIGS. 3 to 8 are block diagrams showing an example of a configuration of CMOS image sensors or solid-state image devices to which the present embodiment is applied.

FIG. 3 shows an example of a configuration of a CMOS image sensor or solid-state image pickup device according to a first embodiment of the present invention.

Referring to FIG. 3, the CMOS image sensor 100 shown includes a pixel array section 101, an address decoder 102, a pixel driving pulse generation circuit 103, a pixel driving section 104, a pixel output data parallel-serial processing section 105, and an output circuit section 106. The CMOS image sensor 100 shown further includes a sensor control section 107, external power supplies 108 and 109 each in the form of a cell, and switches 110 and 111.

Of the components mentioned, the pixel array section 101, address decoder 102, pixel driving pulse generation circuit 103, pixel driving section 104, pixel output data parallel-serial processing section 105, output circuit section 106 and sensor control section 107 are integrated in an IC chip 112.

In the present embodiment, one, plural ones or all of the pixel array section 101, address decoder 102, pixel driving pulse generation circuit 103, pixel output data parallel-serial processing section 105, output circuit section 106 and sensor control section 107 other than the pixel driving section 104 correspond to different circuit sections.

Further, the external power supplies 108 and 109, the switches 110 and 111 and a controller not shown or the sensor control section 107 form a control section.

The IC chip 112 has several terminals formed thereon and including power supply terminals TV1 to TV5 to which a power supply voltage VDD1 is supplied from the external power supply 108 in the form of a cell, power supply terminals TV6 and TV7 to which a power supply voltage VDD2 from the external power supply 109 in the form of a cell is supplied, power supply terminals TG1 to TG6 connected to a ground potential GND, an input terminal TI1 to which, for example, a control signal SCTL is supplied, and an output terminal TO1.

In the IC chip 112, the power supply terminal TV1 is connected to a power supply terminal Pow of the address decoder 102 and the pixel driving pulse generation circuit 103, and the power supply terminal TV2 is connected to a power supply terminal Pow of the pixel driving section 104 while the power supply terminal TV3 is connected to a power supply terminal Pow of the output circuit section 106. Further, the power supply terminal TV4 is connected to a power supply terminal Pow of the pixel output data parallel-serial processing section 105, and the power supply terminal TV5 is connected to a power supply terminal Pow of the sensor control section 107.

Further, the power supply terminal TV6 is connected to a power supply terminal Pow2 of a level shifter group 1041 provided in the pixel driving section 104, and the power supply terminal TV7 is connected to power supply lines LVDD of the pixel array section 101.

The pixel array section 101 includes a plurality of pixel circuits 101A arrayed in a matrix. It is to be noted that, in FIG. 3, the pixel circuits 101A are arrayed in three rows and three columns for simplified illustration.

In FIG. 3, an example of a pixel of the CMOS image sensor formed from four transistors.

Each pixel circuit 101A includes, for example, a photodiode 121 as a photoelectric conversion device, and further includes four transistors including a transfer transistor 122, an amplification transistor 123, a selection transistor 124 and a reset transistor 125 as active devices for the photodiode 121.

The photodiode 121 photoelectrically converts incoming light into charge, here electrons, whose amount corresponds to the light amount of the incoming light.

The transfer transistor 122 is connected between the photodiode 121 and a floating diffusion FD and transfers electrons obtained by photoelectric conversion by the photodiode 121 to the floating diffusion FD when a driving signal is provided to the gate, that is, a transfer gate, of the transfer transistor 122 through a transfer control line LTx.

The amplification transistor 123 is connected at the gate thereof to the floating diffusion FD. The amplification transistor 123 is connected to a signal line LSGN through the selection transistor 124 and cooperates with a constant current source outside the pixel to form a source follower.

If an address signal is provided to the gate of the selection transistor 124 through the selection control line LSEL to turn on the selection transistor 124, then the selection transistor 124 amplifies the potential at the floating diffusion FD and outputs a signal corresponding to the amplified potential to the signal line LSGN. The voltage outputted from each pixel is outputted to the pixel output data parallel-serial processing section 105 through the signal line LSGN.

The operations mentioned are carried out in parallel for pixels of one row since the gates of, for example, the transfer transistors 122, selection transistors 124 and reset transistors 125 are connected in a unit of a row.

A reset control line LRST, a transfer control line LTx and a selection control line LSEL wired in the pixel array section 101 are wired as a set in a unit of a row of the pixel array.

The reset control lines LRST, transfer control lines LTx and selection control lines LSEL are driven by the pixel driving section 104.

The pixel driving section 104 includes a level shifter group 1041 including a plurality of level shifters LS which are control line drivers to which a reset control line LRST, a transfer control line LTx and a selection control line SLEL are individually connected, and a control logic circuit group 1042 for controlling driving of the level shifters LS of the level shifter group 1041.

The level shifter group 1041 includes, for each row of the pixel array, three level shifters LS1, LS2 and LS3 to which a reset control line LRST, a transfer control line LTx and a selection control line LSEL are connected, respectively.

The level shifter group 1041 is placed, upon power on when the power supply voltage VDD2 from the external power supply 109 is supplied through the power supply terminal TV6, into and then retained in an operative state in response to the supply of the power supply voltage VDD2 even if supply of the power supply voltage VDD1 to other devices such as the address decoder stops when the power supply voltage VDD2 is supplied.

The control logic circuit group 1042 includes a plurality of NOR gates NR arrayed corresponding to the array of the level shifters LS of the level shifter group 1041 so as to control the input to the level shifters LS.

Each of the NOR gates NR is connected at an output thereof to an input of a corresponding one of the level shifters LS serving as drivers, at a first input terminal thereof to a corresponding supply line for a driving pulse from the pixel driving pulse generation circuit 103 and at a second input terminal thereof commonly to the input terminal TI1 of the IC chip 112.

To the input terminal TI1, a control signal SCTL, for example, from a controller not shown is supplied.

If the control signal SCTL is supplied at the high level, then at least the transfer control lines LTx can be set to the low level irrespective of the pulse signal from the pixel driving pulse generation circuit 103, and consequently, the pixel circuits 101A can be held in a charge (signal) accumulation state.

The switch 110 is connected at a fixed contact a thereof to the power supply terminals TV1, TV3, TV4 and TV5 of the IC chip 112, at a movable contact b thereof to the positive electrode of the external power supply 108 and the power supply terminal TV2, and at a movable contact c thereof to the negative electrode of the external power supply 108 and the power supply terminals TG1 to TG6.

The switch 110 connects the fixed contact a to the movable contact b or c in response to a changeover signal SW, for example, from a controller not shown or the sensor control section 107.

In particular, upon ordinary general operation, the changeover signal SW is supplied to the switch 110 so as to connect the fixed contact a and the movable contact b to each other. Consequently, the power supply voltage VDD1 from the external power supply 108 is supplied to the address decoder 102 and pixel driving pulse generation circuit 103, pixel driving section 104, pixel output data parallel-serial processing section 105, output circuit section 106 and sensor control section 107 of the IC chip 112 through the power supply terminals TV1 to TV5, respectively.

On the other hand, within a charge accumulation period of the pixel array section 101, the changeover signal SW is supplied to the switch 110 so as to connect the fixed contact a and the movable contact c to each other. Consequently, the power supply terminals TV1, TV3, TV4 and TV5 are connected to the ground potential. As a result, the supply of the power supply voltage VDD1 from the external power supply 108 to the address decoder 102 and pixel driving pulse generation circuit 103, pixel output data parallel-serial processing section 105, output circuit section 106 and sensor control section 107 of the IC chip 112, respectively, is stopped.

The switch 111 is connected at a fixed contact a thereof to the power supply terminal TV7 of the IC chip 112, at a movable contact b thereof to the positive electrode of the external power supply 109 and the power supply terminal TV6, and at a movable contact c thereof to the negative electrode of the external power supply 108.

The switch 111 connects the fixed contact a thereof to the movable contact b or c in response to a changeover signal SW, for example, from the controller not shown or the sensor control section 107.

In particular, upon ordinary general operation, the changeover signal SW is supplied to the switch 111 so as to connect the fixed contact a and the movable contact b to each other. Consequently, the power supply voltage VDD2 from the external power supply 109 is supplied to the power supply lines LVDD of the level shifter group 1041 in the pixel driving section 104 and the pixel array section 101 of the IC chip 112 through the power supply terminals TV6 and TV7.

On the other hand, within a charge accumulation period of the pixel array section 101, the changeover signal SW is supplied to the switch 111 so as to connect the fixed contact a and the movable contact c to each other. Consequently, the power supply terminal TV7 is connected to the ground potential. As a result, the supply of the power supply voltage VDD2 from the external power supply 109 to the power supply lines of the pixel array section 101 of the IC chip 112 is stopped, and the power supply lines LVDD of the pixel array section 101 are held at the ground potential.

In the CMOS image sensor 100 having such a configuration as described above, in normal general operation, the changeover signal SW is supplied to the switch 110 so as to connect the fixed contact a and the movable contact b thereof to each other. Consequently, the power supply voltage VDD1 from the power supply 108 is supplied to the address decoder 102 and pixel driving pulse generation circuit 103, pixel driving section 104, pixel output data parallel-serial processing section 105, output circuit section 106 and sensor control section 107 of the IC chip 112 through the power supply terminals TV1 to TV5, respectively.

Similarly, the changeover signal SW is supplied also to the switch 111 so as to connect the fixed contact a and the movable contact c to each other. Consequently, the power supply voltage VDD2 from the power supply 109 is supplied to the level shifter group 1041 in the pixel driving section 104 and the power supply lines LVDD of the pixel array section 101 of the IC chip 112 through the power supply terminals TV6 and TV7.

In such a state as described above, the sensor control section 107 generates an address for designating a pixel array row to be accessed and sends the address to the address decoder 102.

The address decoder 102 renders an output thereof corresponding to the designated pixel row active. Consequently, a pixel reset pulse LRST and pixel readout pulses LTx and LSEL for each row are supplied from the pixel driving pulse generation circuit 103 to the pixel array section 101, and image outputs from the pixel circuits 101A are transferred to the pixel output data parallel-serial processing section 105 for each row through the signal line LSGN.

Then, image data are outputted one by one pixel from the pixel output data parallel-serial processing section 105 and outputted to the outside of the chip through the output circuit section 106.

If the control signal SCTL is supplied at the high level to the input terminal TI1, then the pixel driving section 104 can set at least the transfer control lines LTx to the low level irrespective of the pulse signal from the pixel driving pulse generation circuit 103, and the pixel circuits 101A are fixed to a charge (signal) accumulation state.

At this time, as described hereinabove, within a charge accumulation period of the pixel array section 101, the changeover signal SW is supplied to the switch 110 so as to connect the fixed contact a and the movable contact b to each other. Consequently, the power supply terminals TV1, TV3, TV4 and TV5 are connected to the ground potential. As a result, the supply of the power supply voltage VDD1 from the power supply 108 to the address decoder 102 and pixel driving pulse generation circuit 103, pixel output data parallel-serial processing section 105, output circuit section 106 and sensor control section 107 of the IC chip 112 is stopped.

Similarly, the changeover signal SW is supplied to the switch 111 so as to connect the fixed contact a and the movable contact c to each other. Consequently, the power supply terminal TV7 is connected to the ground potential. As a result, the supply of the power supply voltage VDD2 from the power supply 109 to the power supply lines of the pixel array section 101 of the IC chip 112 is stopped, and the power supply lines LVDD of the pixel array section 101 are held at the ground potential.

In this manner, even if the power supply to the circuits other than the pixel driving section 104 stops, the pixels are maintained in an accumulation state. At this time, leak current which is generated in the overall chip includes only leak current generated at the pixel driving section 104.

As described above, according to the CMOS image sensor 100 of the present embodiment, upon accumulation for a long period of time, heat generation arising from off leak current of the circuits integrated on the CMOS image sensor is suppressed. Consequently, generation of dark current by such heat generation and hence deterioration of the picture quality can be suppressed.

Further, when compared with an alternative popular suppression technique of off leak current which utilizes a substrate bias effect, the suppression of heat generation can be applied only by turning on/off of the power supply, and the circuit configuration of a chip and the system configuration can be designed further readily.

Second Embodiment

Figure 4:
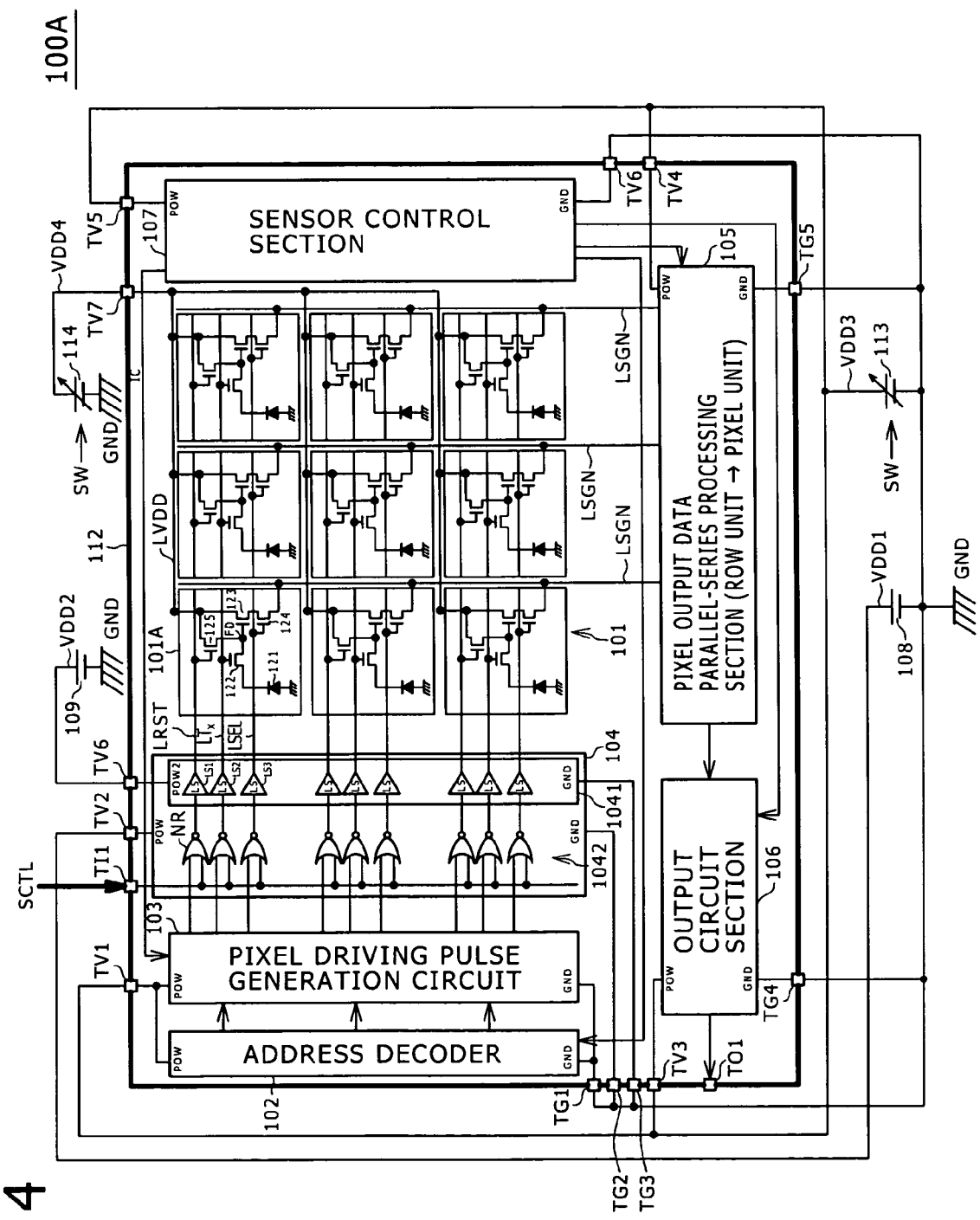

FIG. 4 shows an example of a configuration of a CMOS image sensor or solid-state image pickup device according to a second embodiment of the present invention.

The CMOS image sensor 100A according to the second embodiment is a modification to but is different from the CMOS image sensor 100 according to the first embodiment described above in that it includes variable power supplies 113 and 114 in place of the switches 110 and 111.

In particular, the fixed power supply 108 supplies a power supply voltage VDD1 to the power supply terminal TV2; the fixed power supply 109 supplies a power supply voltage VDD2 to the power supply terminal TV6; the variable power supply 113 supplies a variable power supply voltage VDD3 to the power supply terminals TV1, TV3, TV4 and TV5; and the variable power supply 114 supplies a variable power supply voltage VDD4 to the power supply terminal TV7.

The variable power supplies 113 and 114 receive a control signal SCTL2, for example, from a controller not shown and supply an ordinary power supply voltage VDD upon normal operation but supplies, during a charge accumulation period, a power supply voltage lower than the power supply voltage such as VDD/2 to the object of the voltage supply. More particularly, the variable power supplies 113 and 114 supply a power supply voltage of such a low level that the address decoder 102, pixel driving pulse generation circuit 103, pixel output data parallel-serial processing section 105, output circuit section 106 and sensor control section 107 of the IC chip 112 are kept in an inoperative stage, and preferably of such a low level that leak current of the transistors of the components can be suppressed.

Also in this instance, if the control signal SCTL is supplied at the high level to the input terminal TI1, then the pixel driving section 104 can set at least the transfer control lines LTx to the low level irrespective of the pulse signal from the pixel driving pulse generation circuit 103. Consequently, the pixel circuits 101A are fixed to a charge or signal accumulation state.

At this time, even if the power supply voltage to the address decoder 102, pixel driving pulse generation circuit 103, pixel output data parallel-serial processing section 105, output circuit section 106 and sensor control section 107 other than the pixel driving section 104 is dropped, the pixels are maintained in an accumulation state.

Also in the present second embodiment, an effect of suppressing leak current can be obtained by lowering the power supply voltage. When compared with the first embodiment wherein power supply is stopped completely, the restoration upon re-starting of power supply is carried out more quickly, it is possible to allow some circuit to continue its function.

Third Embodiment

Figure 5:
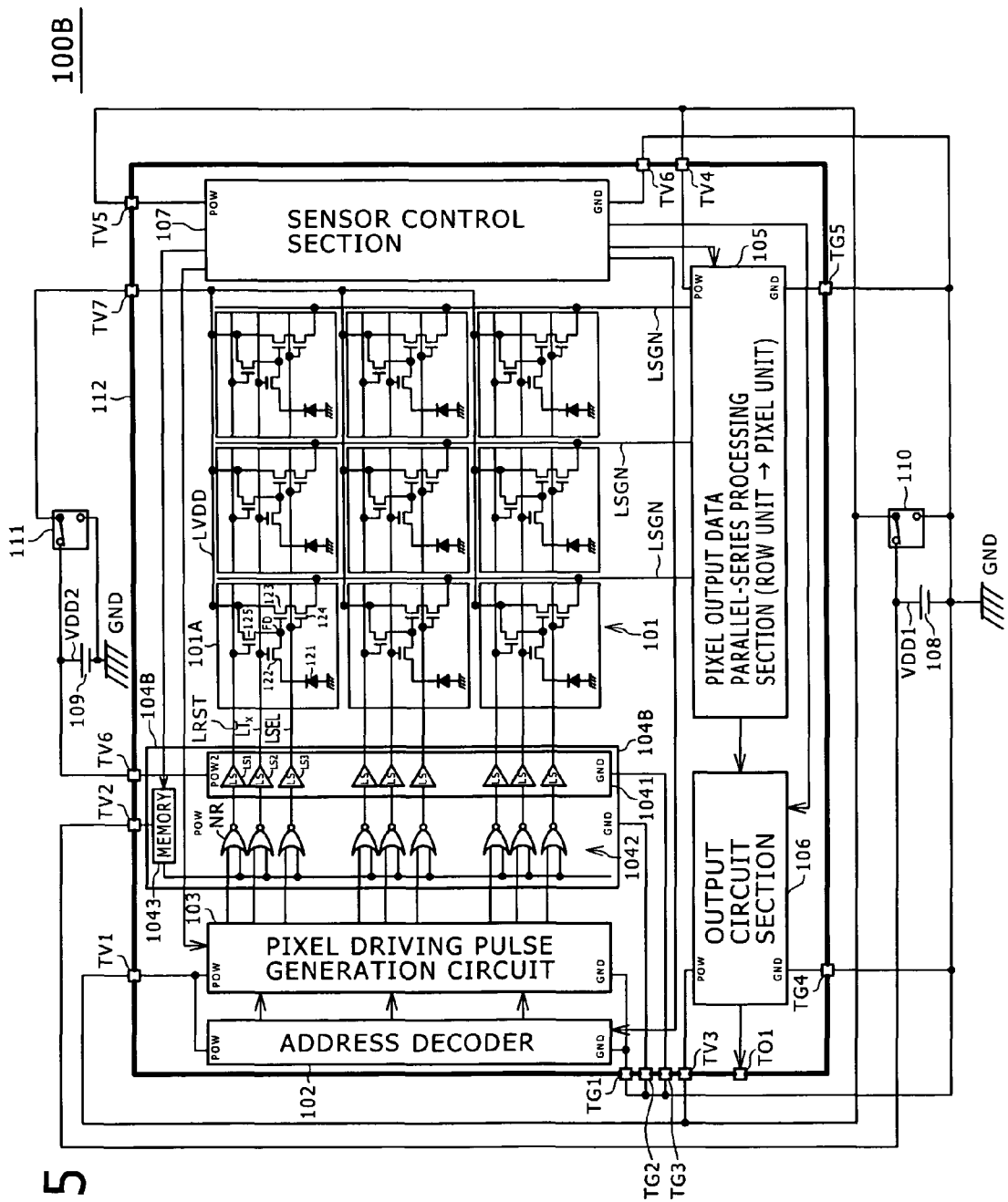

FIG. 5 shows an example of a configuration of a CMOS image sensor or solid-state image pickup device according to a third embodiment of the present invention.

The CMOS image sensor 100B according to the third embodiment is a modification to but is different from the CMOS image sensor 100 according to the first embodiment described above in that the control signal SCTL is not provided from a controller outside of the IC chip 112 but can be generated in the IC chip 112.

In particular, referring to FIG. 5, a memory 1043 is disposed in the pixel driving section 104B to which the power supply voltage VDD1 is supplied from the external power supply 108 such that information for maintaining the pixels in an accumulation state is retained in the memory 1043.

In this instance, the power supply voltage continues to be supplied also to the memory 1043.

For example, information of 1 or 0 of the memory 1043 is controlled by the sensor control section 107 to which the normal power supply voltage VDD3 is supplied.

With the CMOS image sensor 100B of the present third embodiment, advantages similar to those achieved by the CMOS image sensor 100 of the first embodiment can be achieved.

It is to be noted that the configuration of the CMOS image sensor 100B of the third embodiment can be applied also to the CMOS image sensor 100A of the second embodiment described above.

Fourth Embodiment

Figure 6:
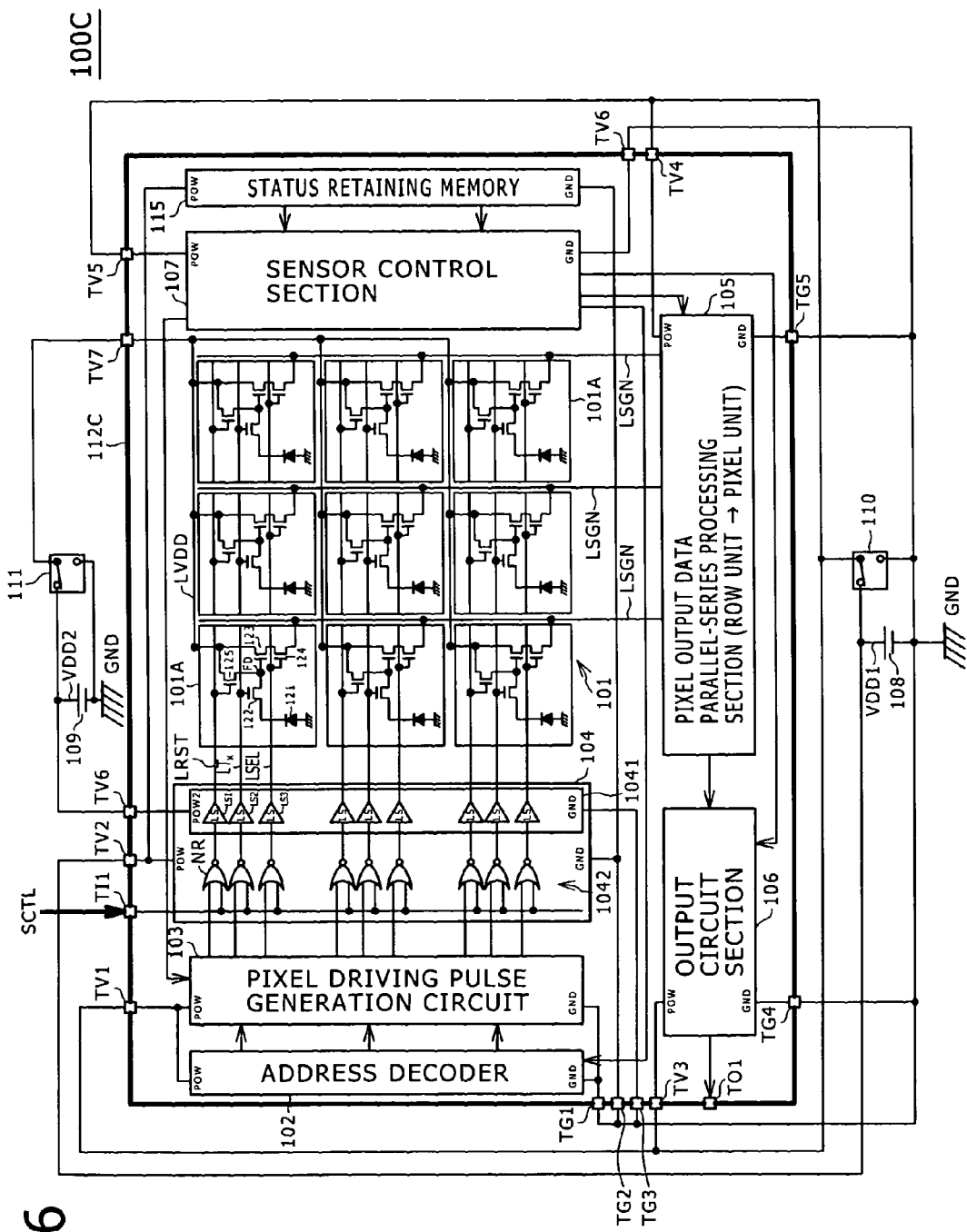

FIG. 6 shows an example of a configuration of a CMOS image sensor or solid-state image pickup device according to a fourth embodiment of the present invention.

Referring to FIG. 6, the CMOS image sensor 100C according to the fourth embodiment is a modification to but is different from the CMOS image sensor 100 according to the first embodiment described above in that it includes a status holding memory 115 having a power supply terminal Pow connected to the power supply terminal TV2 to which the power supply voltage VDD1 is supplied normally is connected.

In the example of FIG. 6, the sensor control section 107 has the status holding memory 115, and the power supply voltage continues to be supplied to the status holding memory 115.

The reason why the status holding memory 115 is provided in the IC chip 112C is described below.

In the first embodiment, if supply of the power supply voltage to the circuits other than the pixel driving section is stopped, then also information which defines the operation status of the blocks to which the supply of the power supply voltage is stopped is lost. Therefore, after supply of the power supply voltage is re-started, it is necessary to start operation beginning with operation for restoring the operation status such as designation of operation, and much time may be required for restoration.

Therefore, in the present fourth embodiment, the power supply voltage continues to be supplied to the status holding memory 115 which designates an operation thereby to eliminate the necessity for re-designation of operation. Consequently, after supply of the power supply voltage is re-started, the time before operation of the chip is started can be reduced.

Fifth Embodiment

Figure 7:
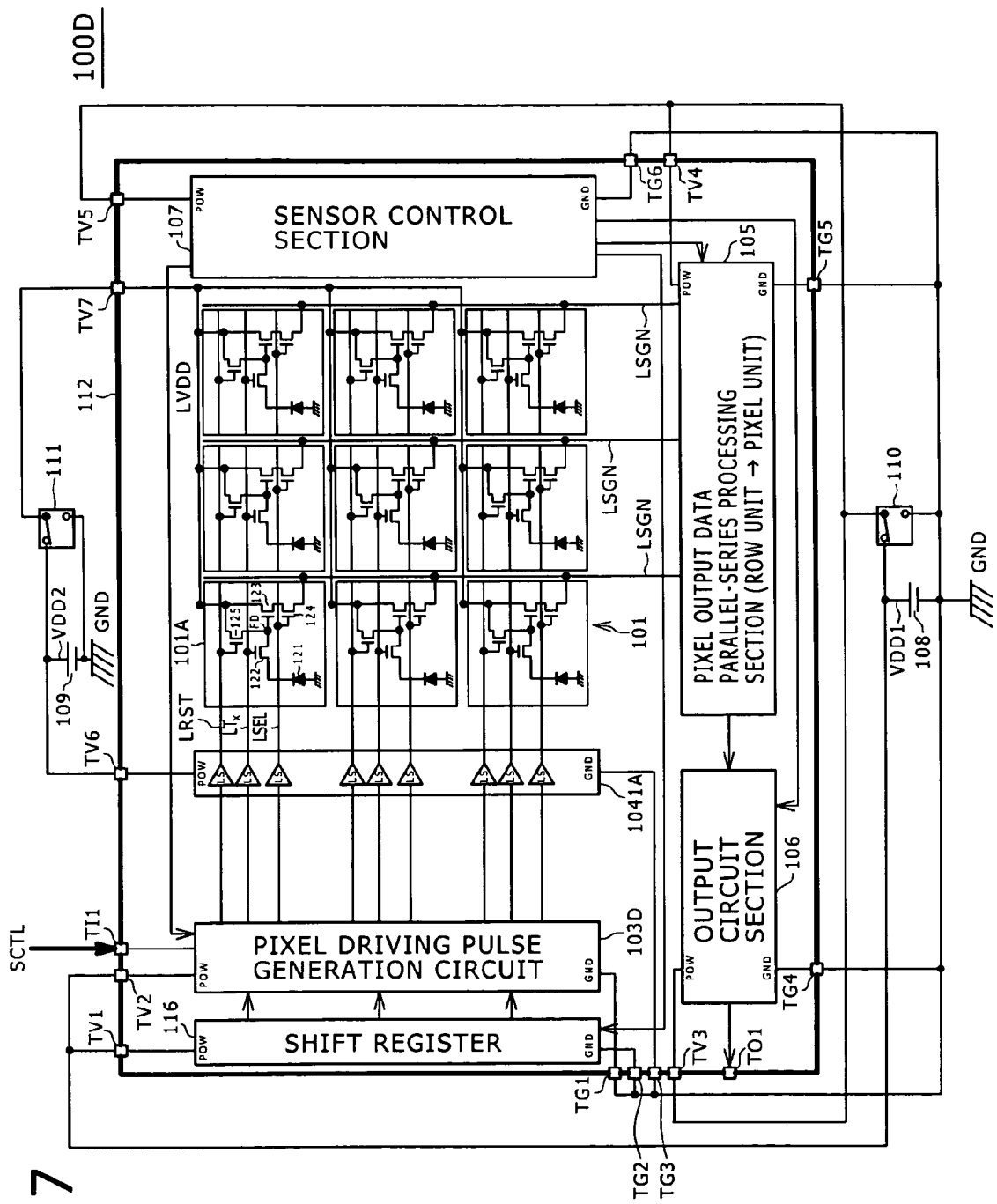

FIG. 7 shows an example of a configuration of a CMOS image sensor or solid-state image pickup device according to a fifth embodiment of the present invention.

Referring to FIG. 7, the CMOS image sensor 100D according to the fifth embodiment is a modification to but is different from the CMOS image sensor 100 according to the first embodiment described above in that it includes a shift register 116 in place of the address decoder 102 and the pixel driving section 104 is formed only from a level shifter group or driver group 1041A. Further, the control signal SCTL supplied from the input terminal TI1 is inputted to the pixel driving pulse generation circuit 103D, and the power supply voltage VDD1 from the external power supply 108 is normally supplied to the shift register 116 and the pixel driving pulse generation circuit 103D.

While, in the first to fourth embodiments described hereinabove, selection of a designated pixel row is carried out by the address decoder 102, in the present fifth embodiment, selection of a pixel row is carried out by the shift register 116.

Since the pixel driving pulse generation circuit 103D generates a driving pulse to a designated row, where an address decoder is used, a driving pulse is supplied only to a designated row.

However, where the shift register 116 is used, all rows can be designated by successively sending "1" to shift-in signals. If the control signal SCTL for issuing an instruction to control a designated row to an accumulation state is provided from the outside through the input terminal TI1 to the pixel driving pulse generation circuit 103D, then the pixels of all rows can be designated to an accumulation state.

Accordingly, in the present fifth embodiment, the power supply voltage continues to be supplied to the shift register 116 and the pixel driving pulse generation circuit 103D.

Sixth Embodiment

Figure 8:
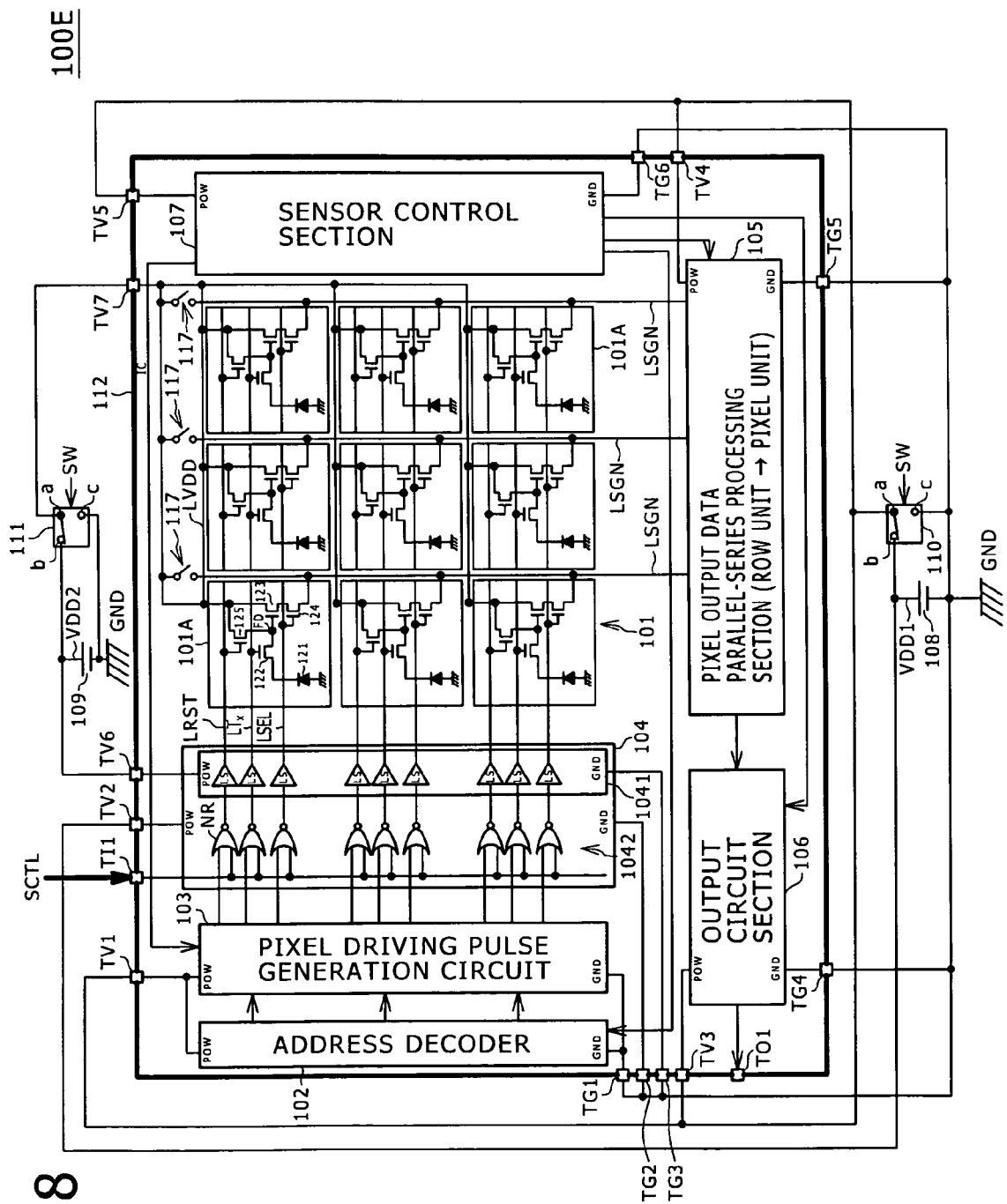

FIG. 8 shows an example of a configuration of a CMOS image sensor or solid-state image pickup device according to a sixth embodiment of the present invention.

Referring to FIG. 8, the CMOS image sensor 100E according to the sixth embodiment is a modification to but is different from the CMOS image sensor 100 according to the first embodiment described above in that, when a pixel output is not read out to a signal line LSGN such as within a charge accumulation period or the like, the potentials at the power supply lines LVDD of the pixel array section 101 and the signal lines LSGN are controlled so as to be equal to each other.

In the present embodiment, a switch 117 is provided between a power supply line LVDD and each signal line LSGN. However, the arrangement of FIG. 8 is an example to the sought end, and various modified forms are possible. For example, a configuration for setting the potential at a signal line LSGN equal to the potential at a power supply line LVDD may be additionally provided on the pixel output data parallel-serial processing section 105 side.

In the pixel circuit 101A, there is the possibility that off leak current may appear between a power supply line LVDD and an output signal line LSGN through the selection transistor 124.

Even if the off leak current amount per one pixel is small, there is the possibility that, as the number of pixels increases, unignorable leak current may appear with the entire pixel array.

Therefore, within a waiting period within which a pixel output is not read out such as, for example, during accumulation for a long period of time, the off leak can be prevented not only by controlling the pixel power supply but also by controlling the power supply line LVDD and the signal line LSGN to the same potential.

As described above, with the CMOS image sensor 100E according to the present embodiment, upon accumulation for a long period of time, heat generation arising from off leak current of the circuits accumulated on the CMOS image sensor is suppressed. Consequently, generation of dark current by such heat generation and hence deterioration of the picture quality can be suppressed.

Further, when compared with an alternative popular suppression technique of off leak current which utilizes a substrate bias effect, the suppression of heat generation can be applied only by turning on/off of the power supply or by voltage control, and the circuit configuration of a chip and the system configuration can be designed further readily.

Further, while, in the third, fourth and fifth embodiments, the memory or shift register continues to be supplied with a power supply voltage, also in those cases, leak current from the memory or shift register can be suppressed by lowering the power supply voltage within a range within which the retained substance is not lost from the memory or shift register as in the second embodiment.

Further, while, in the first to sixth embodiments, stopping of supply or dropping of the power supply voltage to be supplied to the pixel driving sections, particularly to the circuit groups other than the level shifter group 1041 is carried out similarly, the power supply systems in the chip may be classified more finely while similar control is applied individually to the individual systems.

It is to be noted that, while the CMOS image sensors according to the embodiments are not restricted particularly, they may be configured, for example, as CMOS image sensors which incorporate an analog-digital converter (ADC) of the column parallel type.

A solid-state image pickup device which exhibits such effects as described above can be applied as an image pickup device for a digital camera or a video camera.

Figure 9:
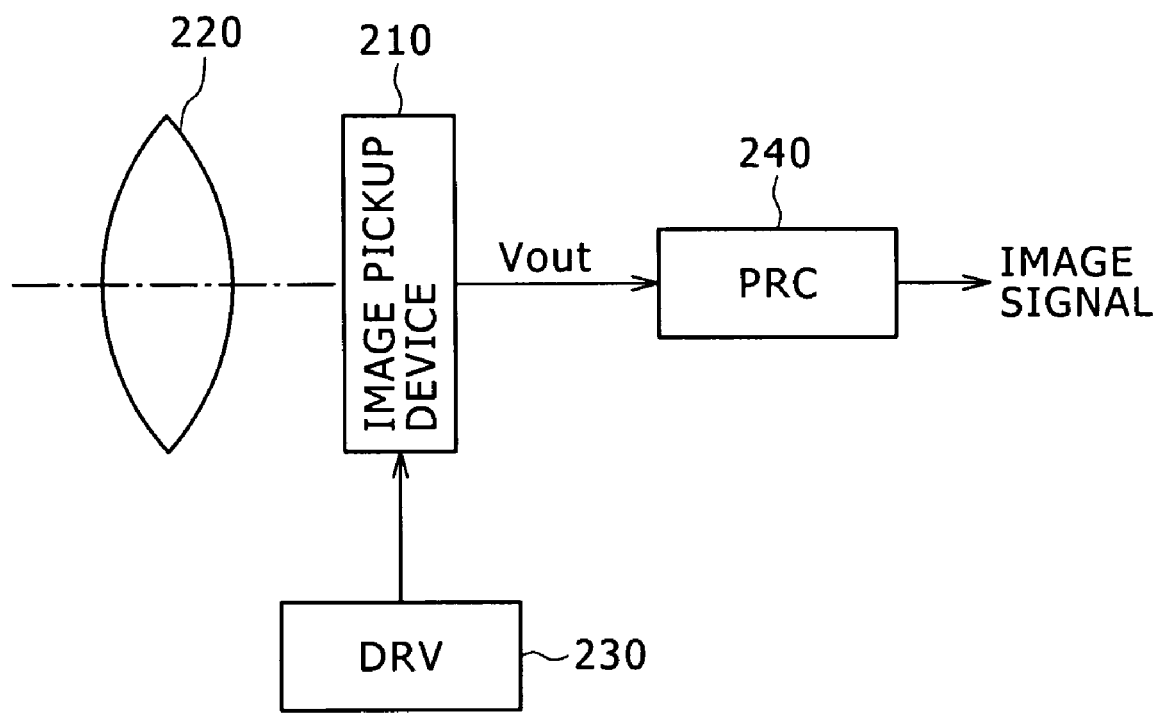
FIG. 9 is a block diagram showing an example of a configuration of a camera system in which any of the solid-state image pickup devices is incorporated.

FIG. 9 shows an example of a configuration of a camera system to which a solid-state image pickup device according to any of the embodiments of the present invention is applied.

Referring to FIG. 9, the camera system 200 shown includes an image pickup device 210 to which any of the CMOS image sensors 100 and 100A to 100E according to the embodiments of the present invention described hereinabove can be applied. The camera system 200 further includes an optical system for introducing incoming light to the pixel region of the image pickup device 210 to form an image of an image pickup object, for example, a lens 220 for forming an image of the incoming light or image light on an image pickup plane. The camera system 200 further includes a driving circuit (DRV) 230 for driving the image pickup device 210, and a signal processing circuit (PRC) 240 for processing an output signal of the image pickup device 210.

The driving circuit 230 has a timing generator not shown for generating various timing signals including a start pulse and a clock pulse for driving the circuits in the image pickup device 210, and drives the image pickup device 210 with predetermined timing signals.

The signal processing circuit 240 carries out signal processes such as correlation double sampling (CDS) for an output signal of the image pickup device 210.

An image signal processed by the signal processing circuit 240 is recorded into a recording medium such as, for example, a memory. The image information recorded in the recording medium is hard copied by a printer or the like. Further, the image signal processed by the signal processing circuit 240 is displayed as moving pictures on a monitor formed from a liquid crystal display apparatus or the like.

As described above, by incorporating any of the CMOS image sensors 100 and 100A to 100E described hereinabove as the image pickup device 210 in an image pickup apparatus such as a digital camera, a camera of high accuracy which exhibits low power consumption can be implemented.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device, comprising:
a pixel section including at least one pixel circuit including a mechanism for converting an optical signal into an electric signal and accumulating the electric signal in response to exposure time;
a pixel driving section configured to drive said pixel section to carry out signal accumulation and signal outputting;
at least one different circuit section configured to carry out a process relating to accessing to said pixel section through said pixel driving section; and
a control section configured to control, at least upon the signal accumulation of said pixel circuit, said pixel driving section so as to maintain said pixel circuit in a state wherein said pixel circuit accumulates the electric signal and control supply of a power supply voltage to said different circuit section,
wherein said pixel driving section maintains said pixel circuit in the state that said pixel circuit accumulates the electric signal in response to a control signal received from said control section, and
wherein said pixel section, pixel driving section and different circuit section are integrated as an integrated circuit, and the control signal is supplied from the outside.

2. The solid-state image pickup device according to claim 1, wherein said control section supplies, upon the signal accumulation of said pixel circuit, the power supply voltage to said pixel driving section and stops the supply of the power supply voltage to said different circuit section.

3. The solid-state image pickup device according to claim 1, wherein said control section supplies, upon the signal accumulation of said pixel circuit, the power supply voltage to said pixel driving section and lowers the power supply voltage and supplies the lowered power supply voltage to said different circuit section.

4. The solid-state image pickup device according to claim 1, wherein said pixel section, pixel driving section and different circuit section are integrated as an integrated circuit, and the control signal is retained in the integrated circuit.

5. The solid-state image pickup device according to claim 1, further comprising a memory section configured to store a status of any of the circuits, to which the supply of the power supply voltage is stopped, before the power supply voltage is supplied,
said control section controlling said memory to retain the stored substance of said memory section also when said different circuit section is in an inoperative state as a result of the control of the supply of the power supply voltage to said different circuit section.

6. The solid-state image pickup device according to claim 1, wherein said pixel circuit includes an active device configured to output the accumulated signal to a signal line, and
said control section controls the potentials at a power supply line to which said active device is connected and the signal line so as to be equal to each other within the signal storage period.

7. A camera system, comprising:
a solid-state image pickup device;
an optical system configured to form an image of an image pickup object on said image pickup device; and
a signal processing circuit configured to process an output image signal of said image pickup device;
said solid-state image pickup device including
a pixel section including at least one pixel circuit having a mechanism for converting an optical signal into an electric signal and accumulating the electric signal in response to exposure time,
a pixel driving section configured to drive said pixel section to carry out signal accumulation and signal outputting,
at least one different circuit section configured to carry out a process relating to accessing to said pixel section through said pixel driving section, and
a control section configured to control, at least upon the signal accumulation of said pixel circuit, said pixel driving section so as to maintain said pixel circuit in a state wherein said pixel circuit accumulates the electric signal and control supply of a power supply voltage to said different circuit section,
wherein said pixel driving section maintains said pixel circuit in the state that said pixel circuit accumulates the electric signal in response to a control signal received from said control section, and
wherein said pixel section, pixel driving section and different circuit section are integrated as an integrated circuit, and the control signal is supplied from the outside.

* * * * *